(12) United States Patent
Chae et al.

(10) Patent No.: US 8,233,068 B2
(45) Date of Patent: Jul. 31, 2012

(54) DECIMATION FILTERS, ANALOG-TO-DIGITAL CONVERTERS INCLUDING THE SAME, AND IMAGE SENSORS INCLUDING THE CONVERTERS

(75) Inventors: Youngcheol Chae, Seoul (KR); In Hee Lee, Seoul (KR); Jimin Cheon, Yongin-si (KR); Gunhee Han, Gwangyang-si (KR); Seog Heon Ham, Suwon-si (KR)

(73) Assignees: Samsung Electronics Co., Ltd., Gyeonggi-do (KR); Industry-Academic Cooperation Foundation, Yonsei University, Seoul (KR)

( * ) Notice: Subject to any disclaimer, the term of this patent is extended or adjusted under 35 U.S.C. 154(b) by 692 days.

(21) Appl. No.: 12/453,593

(22) Filed: May 15, 2009

(65) Prior Publication Data
US 2009/0295956 A1 Dec. 3, 2009

(30) Foreign Application Priority Data
May 27, 2008 (KR) .......................... 10-2008-0049175

(51) Int. Cl.
*H04N 5/335* (2011.01)

(52) U.S. Cl. ....................................................... 348/308
(58) Field of Classification Search .................. 348/308, 348/294; 327/337, 554; 341/150, 172
See application file for complete search history.

(56) References Cited

U.S. PATENT DOCUMENTS
5,909,383 A     6/1999  Lee
7,916,061 B2 *  3/2011  Chae et al. ..................... 341/155

FOREIGN PATENT DOCUMENTS
JP   10-126270     5/1998
JP   2001-077667   3/2001

* cited by examiner

*Primary Examiner* — Hung Dang
(74) *Attorney, Agent, or Firm* — Harness, Dickey & Pierce, P.L.C.

(57) ABSTRACT

An image sensor includes an analog-to-digital converter (ADC) and a decimation filter. The decimation filter includes a first digital data generator and a second digital data generator. The first digital data generator is configured to integrate sigma-delta modulated M-bit pixel data and output N-bit pixel data based on an integration result. The second digital data generator is configured to integrate the N-bit pixel data, generate P-bit pixel data based on an integration result, and output the P-bit pixel data as decimated data.

20 Claims, 18 Drawing Sheets

DECIMATION FILTERS, ANALOG-TO-DIGITAL CONVERTERS INCLUDING THE SAME, AND IMAGE SENSORS INCLUDING THE CONVERTERS

PRIORITY STATEMENT

This non-provisional U.S. patent application claims priority under 35 U.S.C. §119 to Korean Patent Application No. 10-2008-0049175 filed on May 27, 2008, in the Korean Intellectual Property Office, the entire contents of which are incorporated herein by reference.

BACKGROUND

Conventional charge-coupled devices (CCDs) and CMOS image sensors (CISs) are normally used as image sensors. A CIS is more economical than a CCD since the CIS can be manufactured using usual CMOS processes and the CIS is advantageous in integration since analog and digital signal processing circuits can be integrated in the CIS.

SUMMARY

Example embodiments provide a decimation filter for precisely decimating a sigma-delta modulated pixel signal with a simple structure, an analog-to-digital converter including the same, and an image sensor including the converter.

According to at least some example embodiments, a decimation filter includes a first digital data generator configured to integrate sigma-delta modulated M-bit pixel data and output N-bit pixel data based on an integration result. M is a real number and N is a natural number greater than M. The decimal filter further includes a second digital data generator configured to integrate the N-bit pixel data, generate P-bit pixel data based on an integration result, and output the P-bit pixel data as decimated data. P is a natural number greater than N.

The first digital data generator may integrate the M-bit reset data and output N-bit reset data as an integration result when a reset signal is input. The first digital data generator may integrate M-bit image data and output N-bit image data as an integration result when an image signal is input. The second digital data generator may integrate the N-bit reset data, generate P-bit reset data based on an integration result, perform bitwise inversion of the P-bit reset data, add the N-bit image data to bitwise-inverted data, and output an addition result as digital correlated double sampling (CDS) multi-bit pixel data.

The first digital data generator may include first through N-th adding units connected in series. Each of the first through N-th adding units may add a respective input signal and a respective previous output signal and output a carry signal and an output signal which corresponds to the addition result. Output signals of the first through N-th adding units may be the N-bit pixel data.

In at least some other example embodiments the first digital data generator may include first through N-th counter units connected in series. The M-bit pixel data may be provided to the first counter unit as a clock signal. A carry signal of each of the first through N-th counter units may be provided as a clock signal to a succeeding counter unit in the first through N-th counter units.

The second digital data generator may include a lower bit generator configured to integrate the N-bit pixel data and output R-bit pixel data based on an integration result. R is a natural number. The second digital data generator may also include an upper bit generator configured to output Q-bit pixel data in response to a carry signal output from the lower bit generator. Q is a natural number. The P-bit pixel data may include the R-bit pixel data and the Q-bit pixel data.

According to at least some other example embodiments, an analog-to-digital converter including a sigma-delta modulator, is configured to perform sigma-delta modulation of an analog pixel signal and output sigma-delta modulated M-bit pixel data. M is a real number. The analog-to-digital converter may further include a decimation filter configured to decimate the M-bit pixel data and output decimated multi-bit data. The decimation filter includes a plurality of digital data generators connected in cascade. The digital data generators sequentially decimate the M-bit pixel data. The number of digital data generators may be the same as or greater than the number of integrators included in the sigma-delta modulator.

The analog-to-digital converter may be implemented in an image sensor.

BRIEF DESCRIPTION OF THE DRAWINGS

Example embodiments will become more apparent by describing in detail the example embodiments in the attached drawings in which.

DETAILED DESCRIPTION OF EXAMPLE EMBODIMENTS

Figure 1:
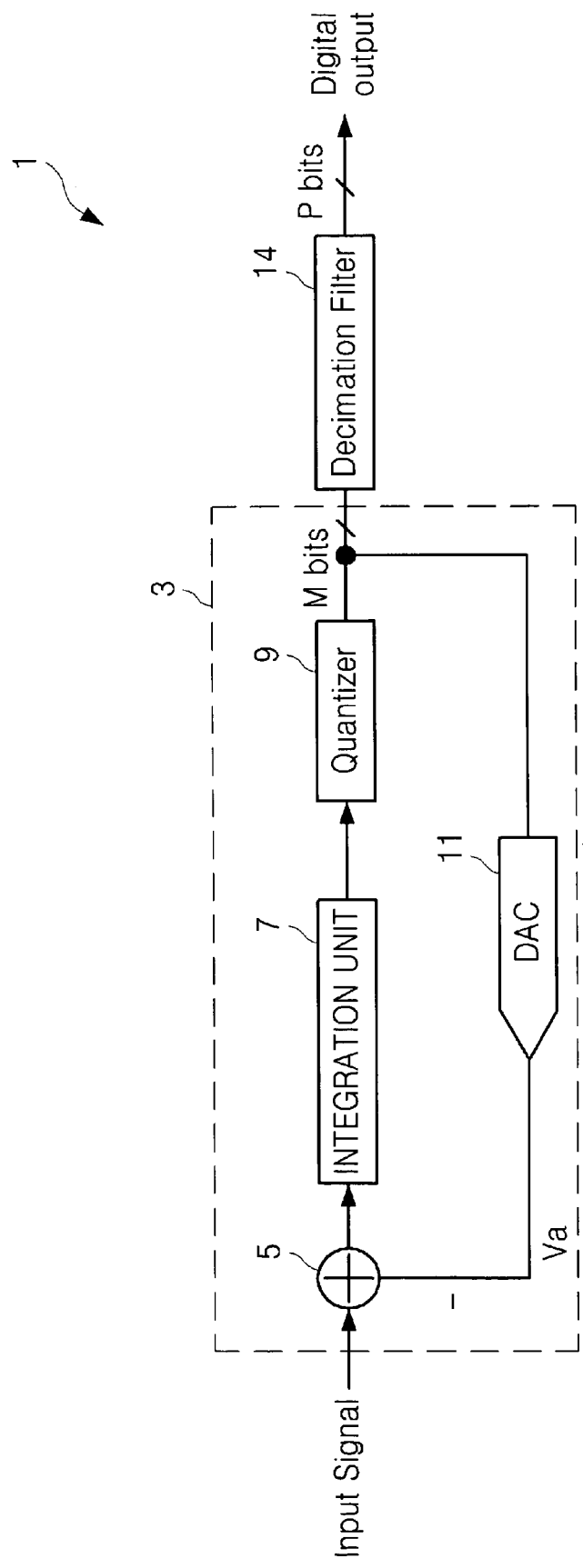
FIG. 1 is a block diagram of a sigma-delta analog-to-digital converter (ADC) according to an example embodiment.

Example embodiments of the present invention will be more clearly understood from the detailed description taken in conjunction with the accompanying drawings.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a sigma-delta analog-to-digital converter (ADC) according to an example embodiment. As shown in FIG. 1, a sigma-delta (or delta-sigma) ADC 1 may include a sigma-delta modulator 3 and a decimation filter 14. The sigma-delta ADC 1 may be used as an image sensor such as a CMOS image sensor.

The sigma-delta modulator 3 may perform sigma-delta modulation of an analog pixel signal. The sigma-delta modulator 3 may receive an input signal, including a reset signal and an image signal, which is output from each of pixels in a pixel array (not shown). The sigma-delta modulator 3 outputs sigma-delta modulated pixel data of M bits. M maybe a real number. As shown in FIG. 1, the sigma-delta modulator 3 may include a subtractor 5, an integration unit 7, a quantizer 9, and a digital-to-analog converter (DAC) 11.

The subtractor 5 may receive the input signal and a feedback signal Va and output a difference between the input signal and the feedback signal Va to the integration unit 7. The feedback signal Va may be an output signal of the quantizer 9 or an output signal of the DAC 11.

The integration unit 7 integrates the difference output from the subtractor 5 and generates an integrated signal. The integration unit 7 may include at least one integrator or feedback loop (not shown). The number of integrators determines the order of the sigma-delta modulator 3. The integrated signal is input to the quantizer 9.

The quantizer 9 may be implemented by a comparator or an ADC. The quantizer 9 may quantize a signal output from the integration unit 7 based on a reference signal (not shown) and generate M-bit pixel data. The M-bit pixel data is input to the decimation filter 14 and the DAC 11.

For example, the sigma-delta modulator 3 may integrate a difference between the input signal and the feedback signal Va and output M-bit pixel data through sigma-delta modulation in which an integrated signal is quantized based on a reference signal. The M-bit pixel data may be a 1-bit digital bit stream. Alternatively, the sigma-delta modulator 3 may integrate a difference between the input signal and the feedback signal Va and output M-bit pixel data through sigma-delta modulation in which an integrated signal is quantized based on two reference signals. At this time, the M-bit pixel data may be 1.5-bit pixel data, that is, data that has two bits and includes one forbidden data (e.g., "00", "01", "10", or "11").

The decimation filter 14 converts the M-bit pixel data output from the sigma-delta modulator 3 into decimated multi-bit pixel data, i.e., a digital output. For example, the decimation filter 14 may extract low-frequency components from the M-bit pixel data, convert the low-frequency components into P-bits pixel data, and output decimated multi-bit pixel data, i.e., a digital output corresponding to the analog pixel data, i.e., the input signal.

Figure 2:
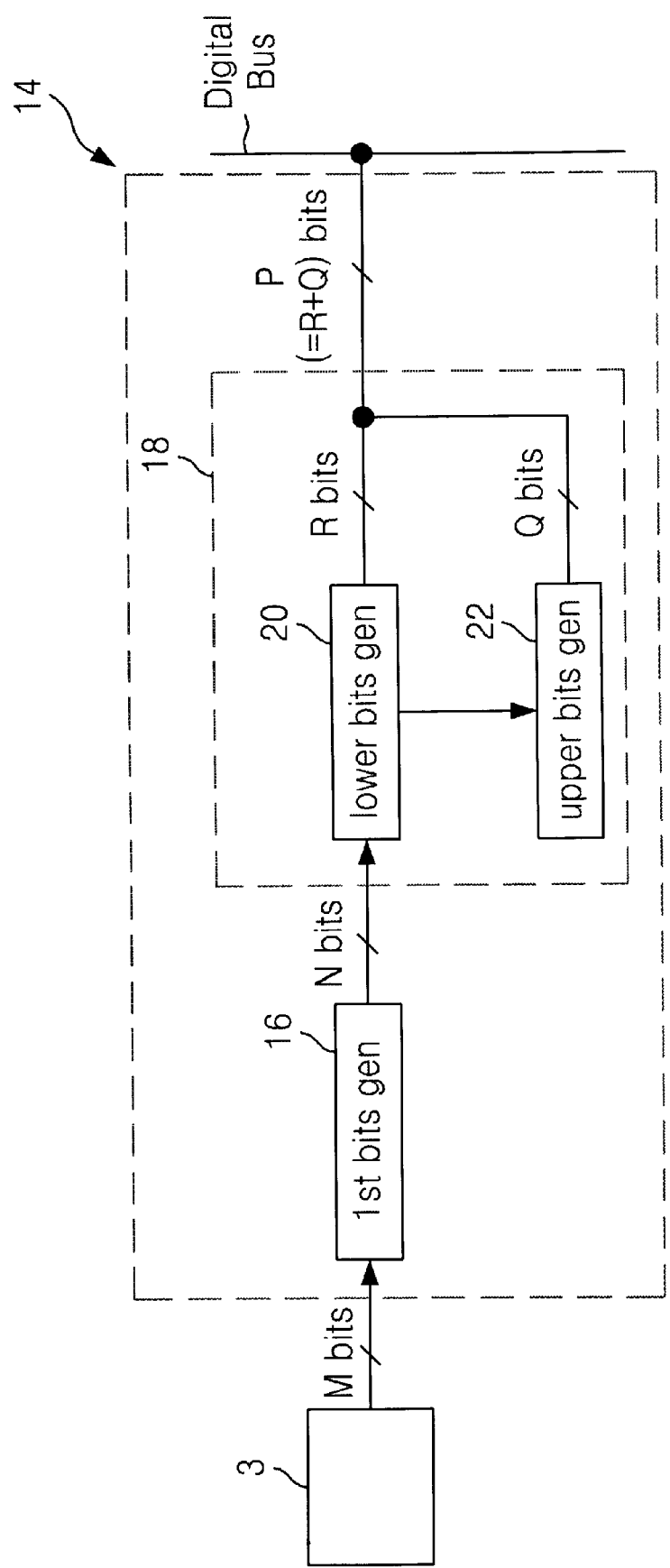
FIG. 2 is a block diagram of a decimation filter illustrated in FIG. 1 according to an example embodiment.

The decimation filter 14 may include a plurality of digital data generators which are connected with each other in cascade and sequentially decimate M-bit pixel data. The number of digital data generators may be the same as or greater than the number of integrators included in the sigma-delta modulator 3. For example, the decimation filter 14 may include a first digital data generator 16 and a second digital data generator 18, as shown in FIG. 2. The second digital data generator 18 may include a lower bit generator 20 and an upper bit generator 22.

The first digital data generator 16 may integrate sigma-delta modulated M-bit pixel data from the sigma-delta modulator 3 and output N-bit pixel data based on an integration result. N may be a natural number greater than M. For example, the first digital data generator 16 may add current M-bit pixel data to previous M-bit pixel data and output N-bit pixel data.

The first digital data generator 16 may count sigma-delta modulated M-bit pixel data and output first N-bit pixel data based on a count result.

Figure 3:
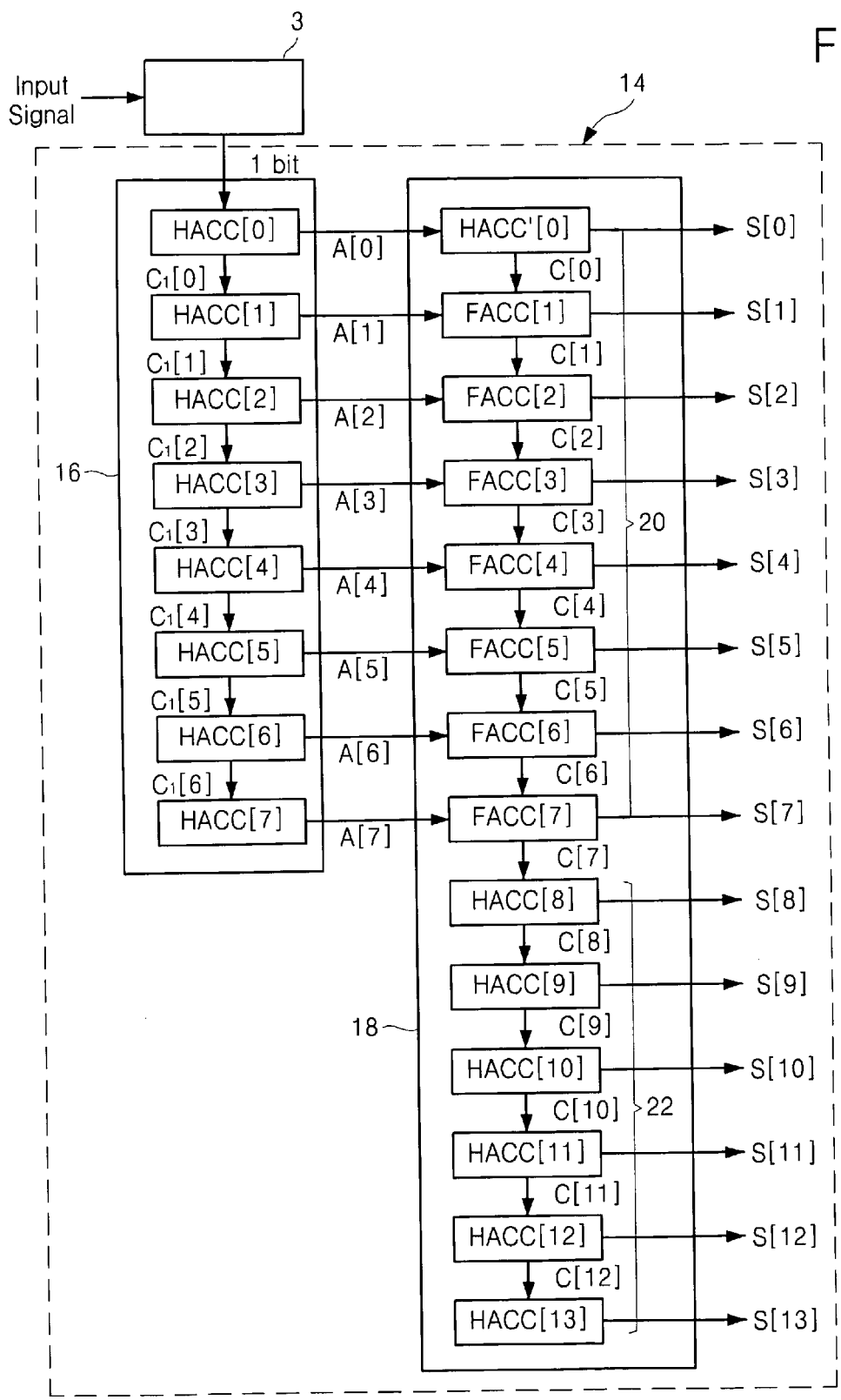
FIG. 3 is a detailed circuit diagram of a decimation filter according to an example embodiment.

FIG. 3 illustrates an example of the first digital data generator 16 and the second digital data generator 18. The first digital data generator 16 may include a plurality of adding units HACC[0] through HACC[7] connected in series, as illustrated in FIG. 3. Each of the adding units HACC[0] through HACC[7] may add an input signal to its previous output signal and output an addition result. Each of the adding units HACC[0] through HACC[7] may include an adder and a latch circuit. The adder may be a half adder.

Figure 4A:
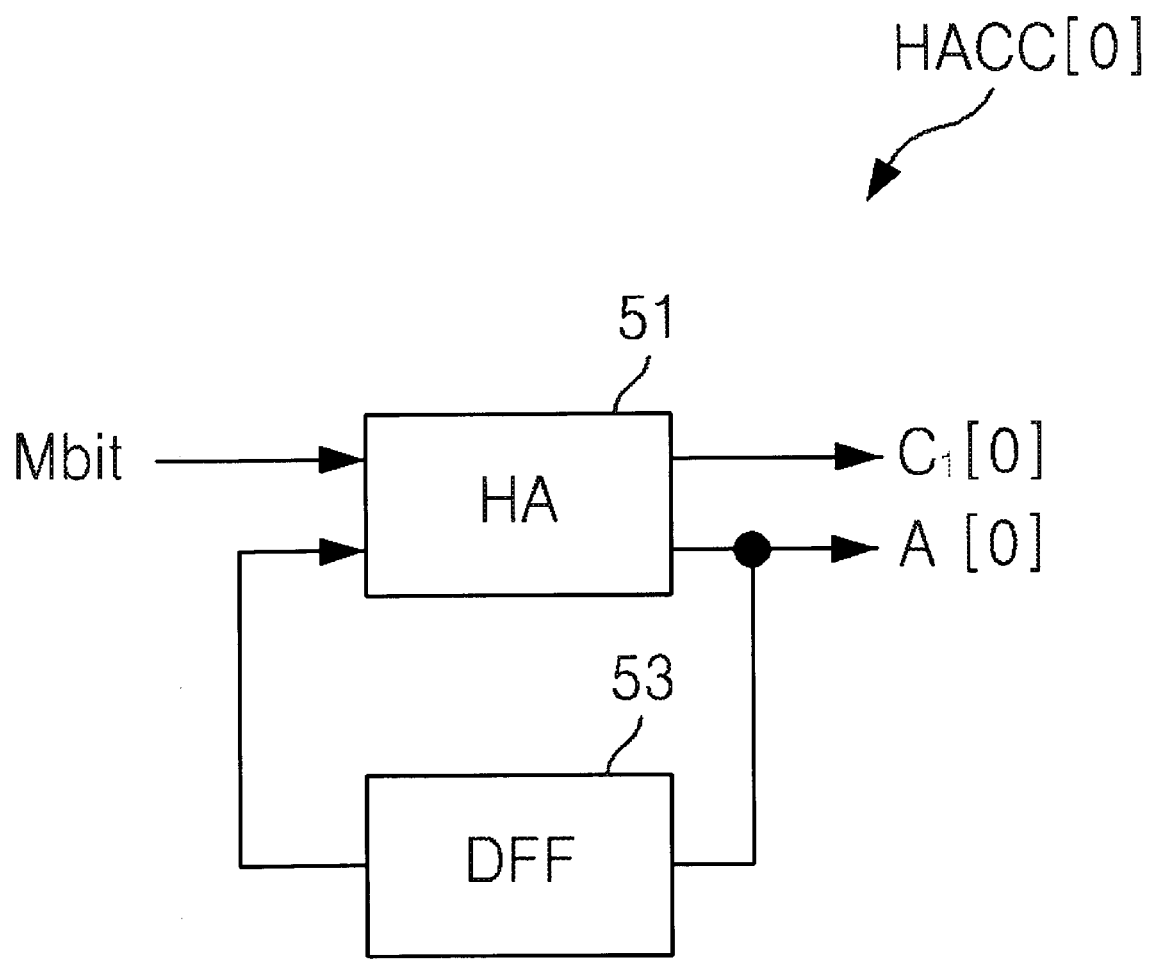
FIGS. 4A through 4C illustrate adding units manifested in a decimation filter according to an example embodiment.

FIG. 4A illustrates an example embodiment of the adding unit HACC[O]. Each of the adding units HACC[O] through HACC[7] has the same configuration. Since HACC[O] is discussed in detail below, a detailed description of HACC[1] through HACC[7] will not be provided for the sake of clarity and brevity.

An adder 51 of the first adding unit HACC[0] a may add an input signal, e.g., M-bit pixel data, and an output signal of a latch circuit 53. The adder 51 may output a carry signal $C_1[0]$ and an output signal A[0], which correspond to an addition result. The output signal of the latch circuit 53 corresponds to a previous output signal of the first adding unit HACC[0]. At a time point t at which M-bit pixel data is input to the first adding unit HACC[0], the output signal of the latch circuit 53 may be a signal output from the first adding unit HACC[0] before t, e.g., t−1. The latch circuit 53 may latch the output signal A[0] of the adder 51 based on a clock signal (not shown) and output a latched signal as a previous output signal of the adder 51. The latch circuit 53 may be implemented by a D flip-flop, for example.

Each of the adding units HACC[0] through HACC[6] outputs a carry signal $C_1[O]$ through $C_1[6]$ to a succeeding adding unit as an input signal and provides an output signal to the second digital data generator 18. For example, the second adding unit HACC[1] may add the carry signal $C_1[0]$ output from the first adding unit HACC[0] to its previous output signal, provide a carry signal $C_1[1]$ to the third adding unit HACC[2], and provide an output signal A[1] to the second digital data generator 18.

The second digital data generator 18 may integrate N-bit pixel data output from the first digital data generator 16, e.g., A[O]-A[7], generate multi-bit (e.g., P-bit) pixel data based on an integration result, and output the P-bit pixel data as decimated data. P may be a real number. In detail, the second digital data generator 18 may output P-bit pixel data, e.g., 14-bit pixel data S[0] through S[13], based on first N-bit pixel data A[0] through A[7] from the first digital data generator 16 and second N-bit pixel data stored in the second digital data generator 18.

As stated above, the second digital data generator 18 may include a lower bit generator 20 and an upper bit generator 22. The lower bit generator 20 may add each of the first N-bit pixel data A[0] through A[7] and a corresponding bit of the second N-bit pixel data and output R-bit (where R is a real number, e.g., 8) pixel data S[0] through S[7] based on an addition result. P-bit pixel data S[0] through S[13] may be composed of R-bit pixel data S[0] through S[7] and Q-bit pixel data S[8] through S[13], hence, P=Q+R.

The lower bit generator 20 may include a plurality of adding units HACC'[0] and FACC[1] through FACC[7] connected in series, as illustrated in FIG. 3. Each of the adding units HACC'[0] and FACC[1] through FACC[7] may add an input signal and its previous output signal and output an addition result. Among the adding units HACC'[0] and FACC[1] through FACC[7], the adding unit HACC'[0] may include a half adder and each of the adding units and FACC[1] through FACC[7] may include a full adder.

Figure 4B:
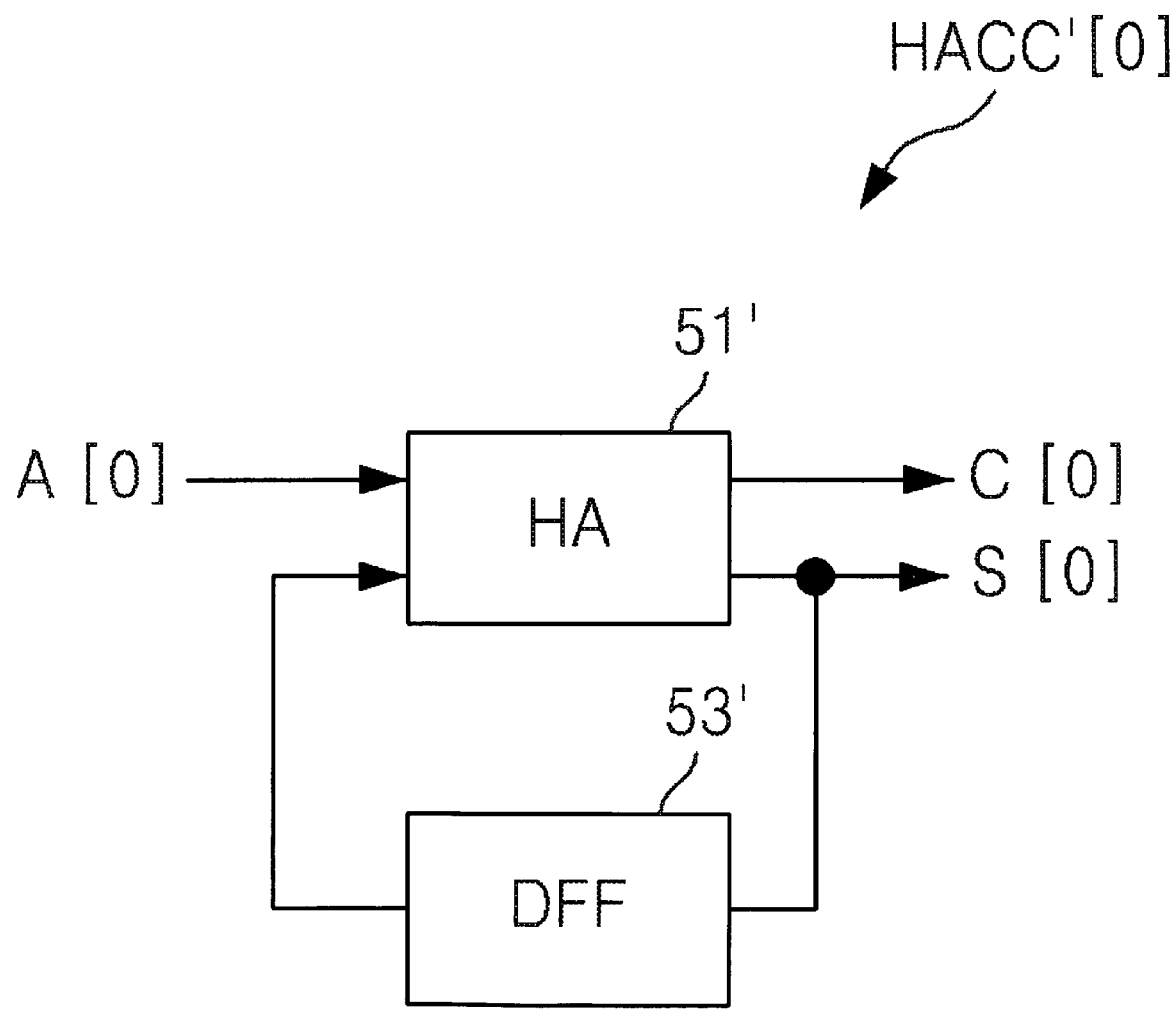

For example, as illustrated in FIG. 4B, the adding unit HACC'[0] may include an adder 51' and a latch circuit 53'. The adder 51' may be a half adder.

The adder 51' of the first adding unit HACC'[0] may add an input signal (e.g., the output signal A[0] of the adding unit HACC[0] in the first digital data generator 16) and an output signal of the latch circuit 53'. The adder 51' may output a carry signal C[0] and an output signal S[0], which correspond to an addition result. The output signal of the latch circuit 53' corresponds to a previous output signal of the first adding unit HACC'[0]. At a time point that which the output signal A[0] from the first digital data generator 16 or 16' is input to the first adding unit HACC'[0], the output signal of the latch circuit 53' may be a signal output from the first adding unit HACC'[0] before t, e.g., t−1. The latch circuit 53' may latch an output signal of the adder 51' based on a clock signal (not shown) and output a latched signal as a previous output signal. The latch circuit 53' may be implemented by a D flip-flop.

The adding units FACC[1] through FACC[7] may be implemented using a full adder. Each of the adding units FACC[1] through FACC[7] may include an adder and a latch circuit. It should be understood that the adding units FACC[1] through FACC[7] have the same configuration. Therefore, for the sake of clarity and brevity, the detailed descriptions of the adding units FACC[2] through FACC[7] will not be provided.

Figure 4C:
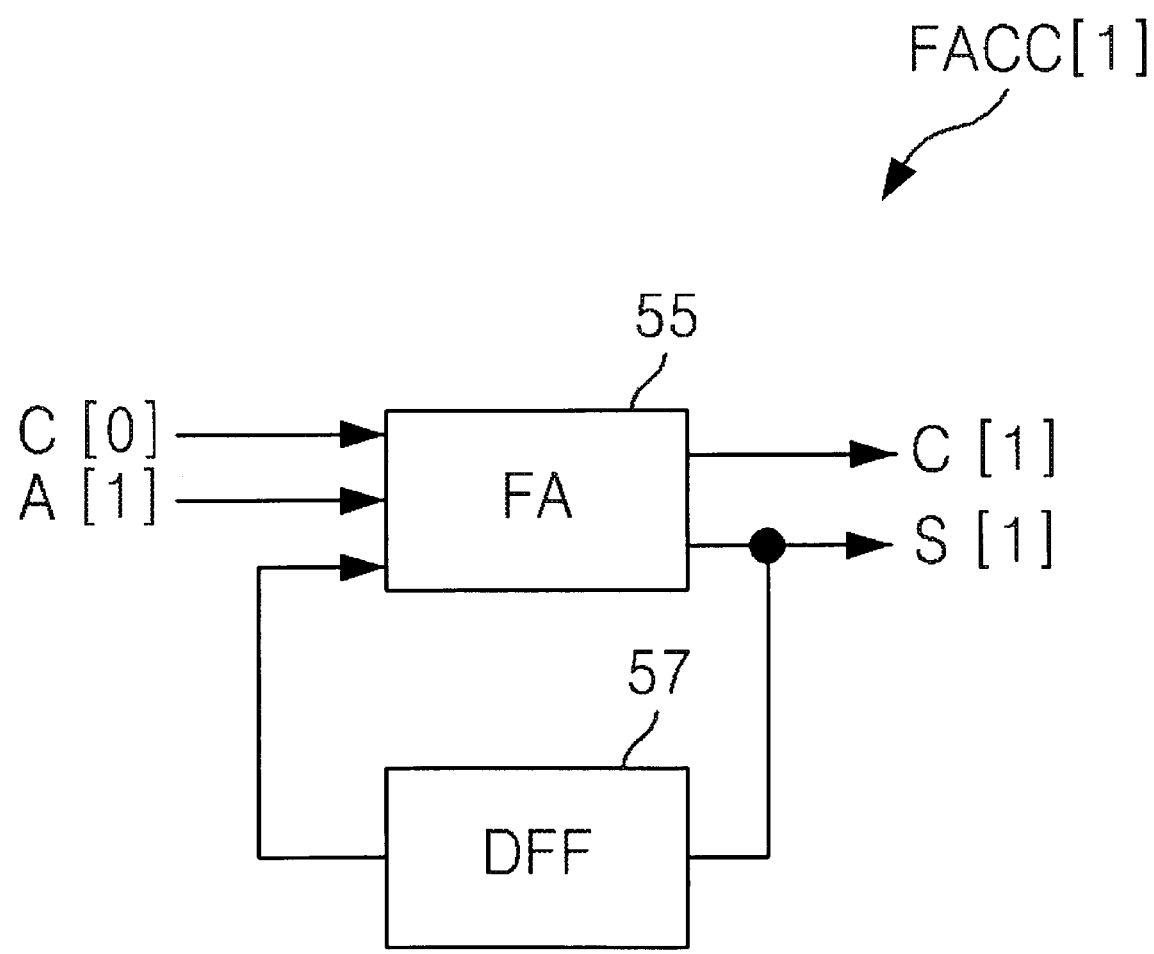

As illustrated in FIG. 4C, the adding unit FACC[1] may include an adder 55 and a latch circuit 57. The adder 55 may be a full adder. For example, the adder 55 of the adding unit FACC[1] may add an input signal (e.g., the output signal A[1] from the adding unit HACC[1]), an output signal of the latch circuit 57, and the carry signal C[0] output from the adding unit HACC'[0] and may output a carry signal C[1] and an output signal S[1], which correspond to an addition result. The output signal of the latch circuit 57 corresponds to a previous output signal of the adding unit FACC[1]. At a time point t at which the output signal A[1] from the first digital data generator 16 is input to the second adding unit FACC[1], the output signal of the latch circuit 57 may be a signal output from the second adding unit FACC[1] before t, e.g., t−1. The latch circuit 57 may latch an output signal of the adder 55 based on a clock signal (not shown) and output a latched signal as a previous output signal. The latch circuit 57 may be implemented by a D flip-flop.

Among the adding units HACC'[0] and FACC[1] through FACC[7] included in the lower bit generator 20, a preceding adding unit may provide a carry signal, which is generated as a result of adding an input signal and a previous output signal, to a succeeding adding unit as an input signal. For example, the adding unit FACC[1] may add its previous output signal and the carry signal C[0] output from the first adding unit HACC'[0] and provide the carry signal C[1] corresponding to an adding result to the third adding unit FACC[2].

The upper bit generator 22 may output Q-bit pixel data in response to a carry signal (e.g., C[7]) output from the lower bit generator 20. The upper bit generator 22 may include a plurality of adding units HACC[8] through HACC[13] connected in series, as illustrated in FIG. 3. Each of the adding units HACC[8] through HACC[13] may add an input signal and it previous output signal and output an addition result. Each of the adding units HACC[8] through HACC[13] has the same configuration as the adding unit HACC[0] described above with reference to FIG. 4A. Thus, for the sake of clarity and brevity, detailed descriptions thereof will not be provided.

Figure 5:
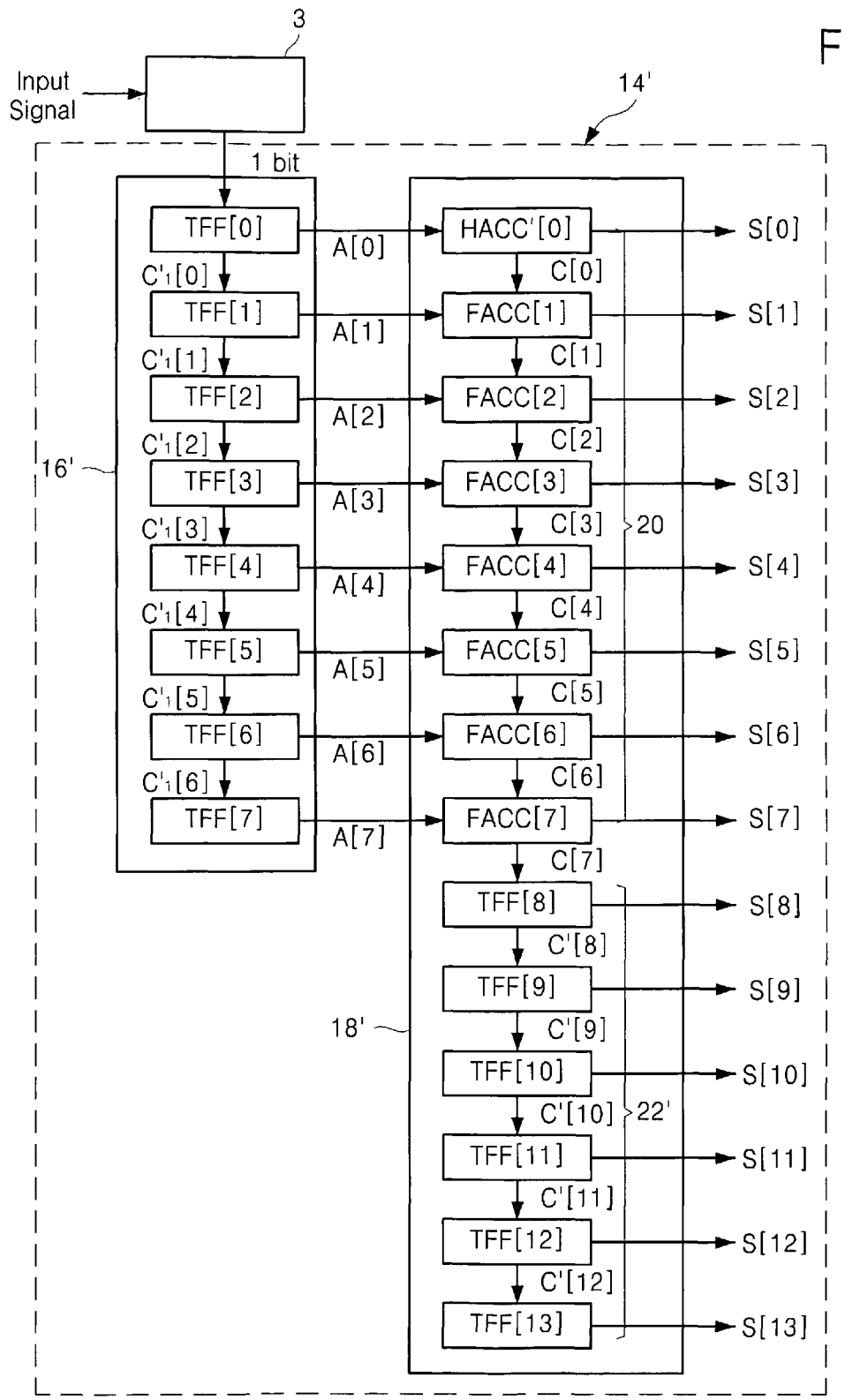
FIG. 5 is a detailed circuit diagram of a decimation filter according to another example of embodiment.

In another example embodiment, a decimal filter 14' may include a first digital data generator 16' having a plurality of counter units TFF[0] through TFF[7] connected in series, as illustrated in FIG. 5. Among the counter units TFF[0] through TFF[7], an output signal of a preceding counter unit may be provided as a clock signal to a succeeding counter unit. For example, the first counter unit TFF[0] may receive and count M-bit pixel data, output a count result A[0] to a second digital data generator 18', and provide the count result A[0] or an inverted count result to the second counter unit TFF[1] as a clock signal $C'_1[0]$. Each of the counter units TFF[0] through TFF[7] may be implemented by at least one T flip-flop or D flip-flop.

The second digital data generator 18' may include an upper bit generator 22' and the lower bit generator 20. The upper bit generator 22' may include a plurality of counter units TFF[8] through TFF[13] connected in series, as illustrated in FIG. 5. Among the counter units TFF[8] through TFF[13], an output signal of a preceding counter unit may be provided as a clock signal to a succeeding counter unit. For example, the counter unit TFF[8] may receive and count a carry signal (e.g., C[7] from the adding unit FACC[7]) output from the lower bit generator 20, output a count result S[8], and provide the count result or an inverted count result to the second counter unit TFF[9] as a clock signal C'[8].

The number of transistors in the counter units TFF[8] through TFF[13] included in the upper bit generator 22' may be less than the number of transistors in the adding units HACC[8] through HACC[13] included in the upper bit generator 22 of FIG. 3. Accordingly, when the upper bit generator 22' of the decimation filter 14' is implemented using the counter units TFF[8] through TFF[13], an area of the decimation filter 14' in an image sensor can be reduced. Each of the counter units TFF[8] through TFF[13] may be implemented by at least one T flip-flop or D flip-flop.

Figure 6:
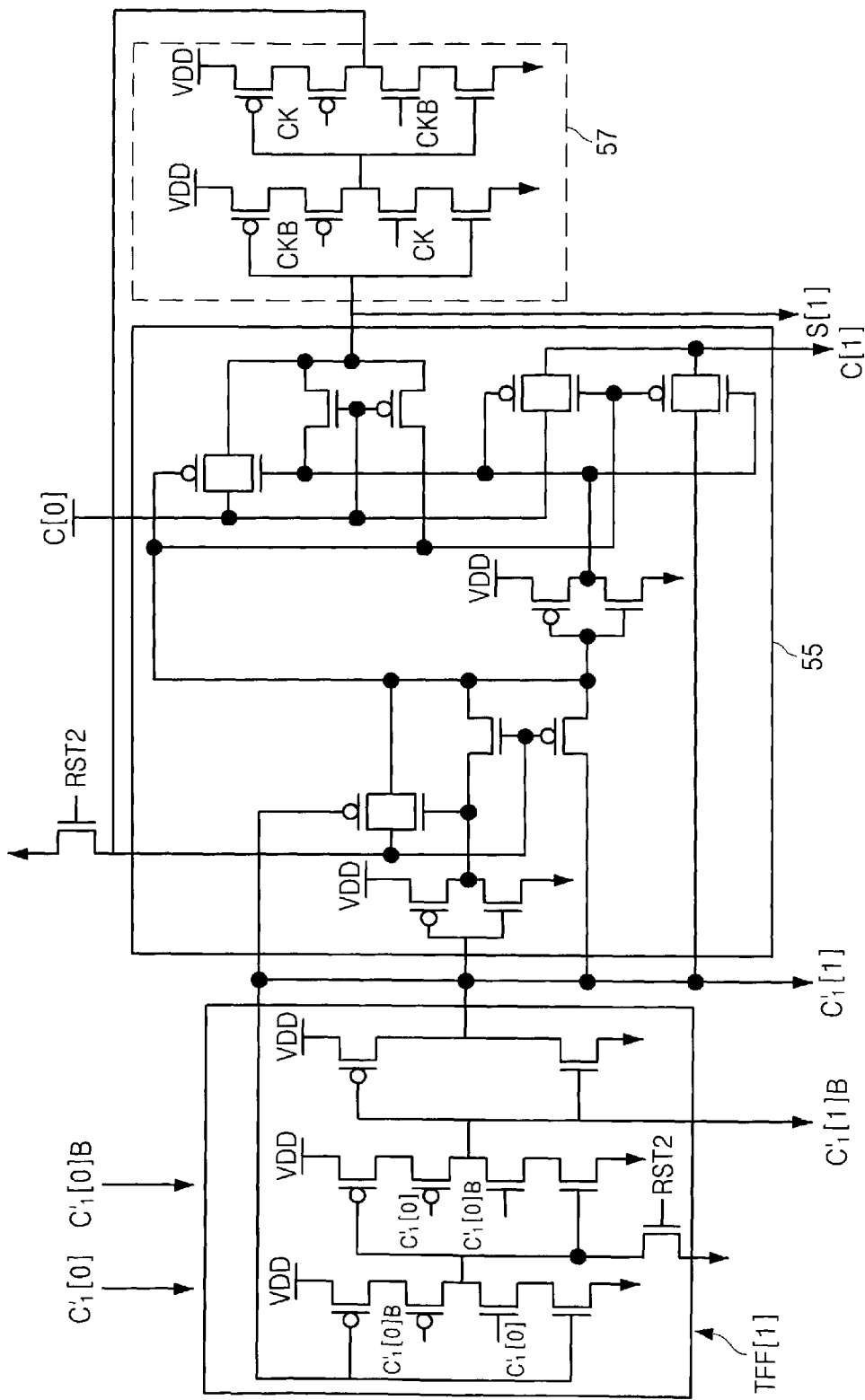
FIG. 6 is a detailed circuit diagram of a counter unit and an adding unit manifested in a decimation filter according to another example embodiment.

FIG. 6 is a detailed circuit diagram of a counter unit and an adding unit, which are manifested in the decimation filter 14' illustrated in FIG. 5. Referring to FIGS. 5 and 6, the counter unit TFF[1] may be reset by a reset signal RST2. The counter unit TFF[1] may receive and count the carry signal C'$_1$[0] and an inverted carry signal C'$_1$[0]B from the preceding counter unit TFF[0] as clock signals, and output a count result C'$_1$[1] and an inverted count result C'$_1$[1]B.

The adder 55 of the adding unit FACC[I] may be reset by the reset signal RST2. The adder 55 adds the count result C'$_1$[1] from the counter unit TFF[1], the carry signal C[0] from the adding unit HACC'[0], and an output signal of the latch circuit 57, and outputs the carry signal C[1] and the output signal S[1], which correspond to an addition result. The latch circuit 57 latches the output signal S[1] of the adding unit FACC[1] based on a clock signal CK.

The second digital data generators may perform digital correlated double sampling (CDS) based on the first N-bit pixel data A[0] through A[7] and second N-bit pixel data. A process in which the second digital data generators perform digital CDS will be described in detail below.

Figure 7A:
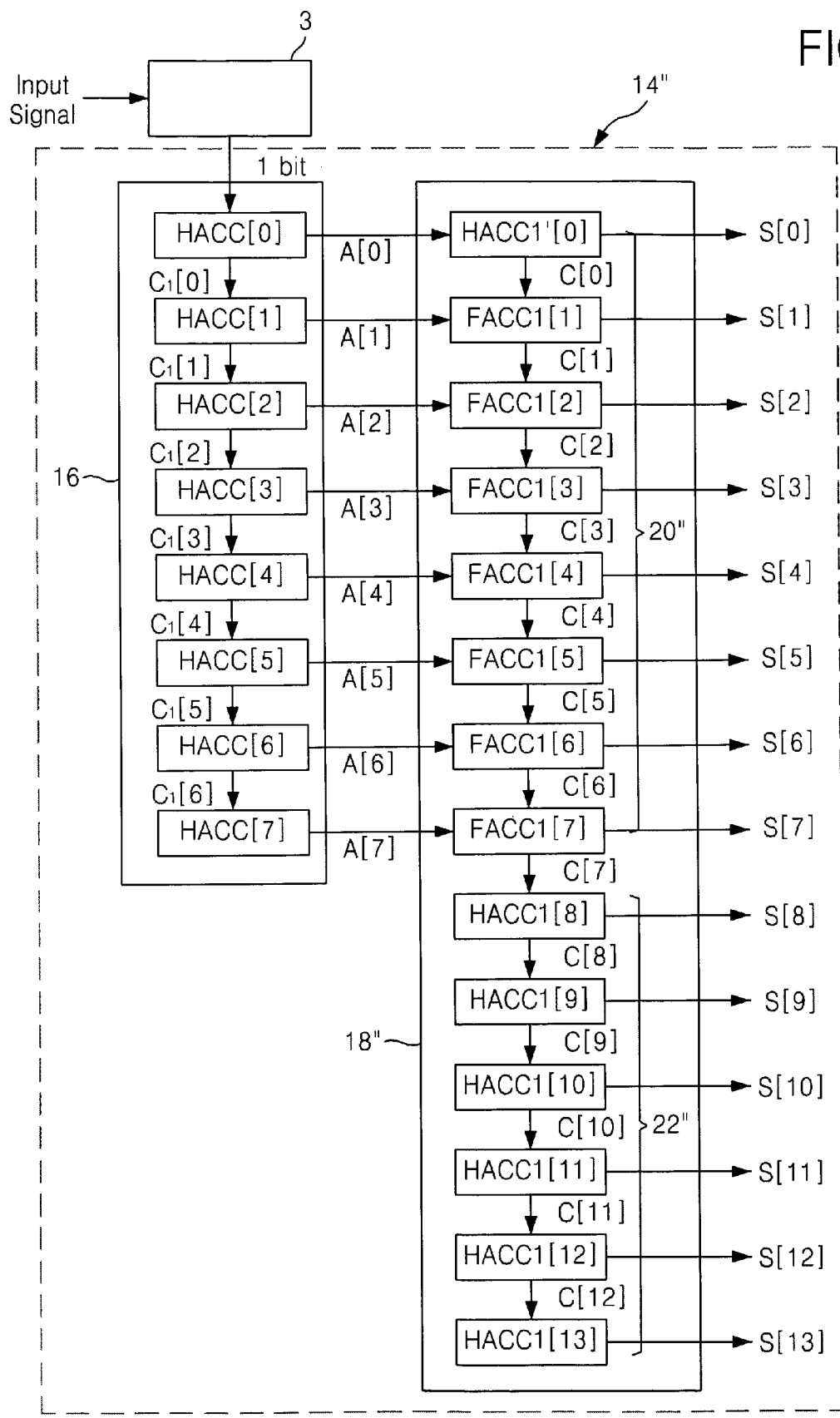
FIGS. 7A and 7B illustrate example embodiments of decimation filters.

FIG. 7A illustrates another example embodiment of a decimation filter. As shown, a decimation filter 14" includes the first digital data generator 16 (also illustrated in FIG. 3) and a second digital data generator 18". The decimation filter 14" is configured in the same manner as the decimation filter 14 e.g., the first digital data generator 16 outputs data to the second digital data generator 18", except for the internal configuration of the adding units. Therefore, for the sake of clarity and brevity, the adding units of the decimation filter 14" will be discussed.

Figure 8A:
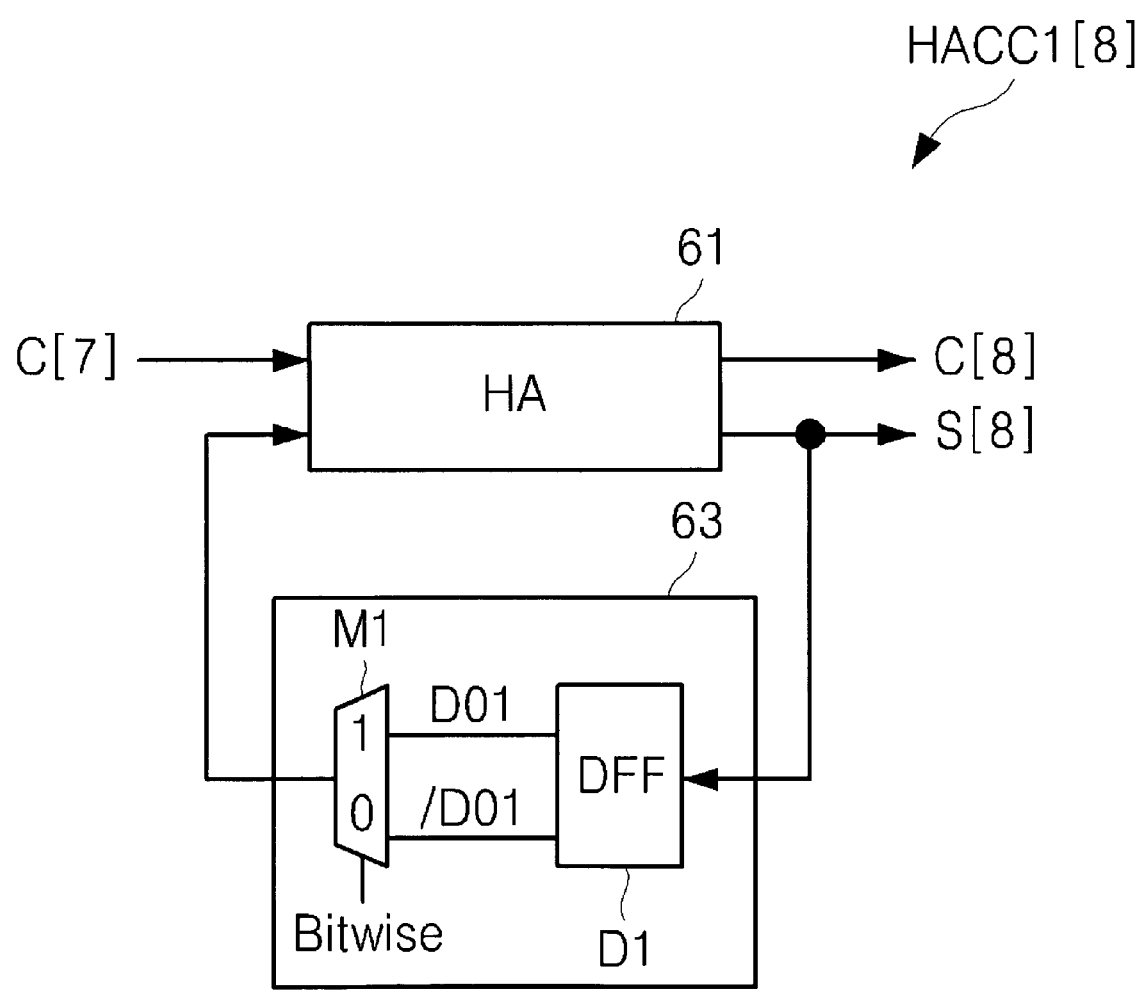
FIGS. 8A through 8D illustrate adding units and a counter unit manifested in decimation filters according to an example embodiments.
Figure 8B:
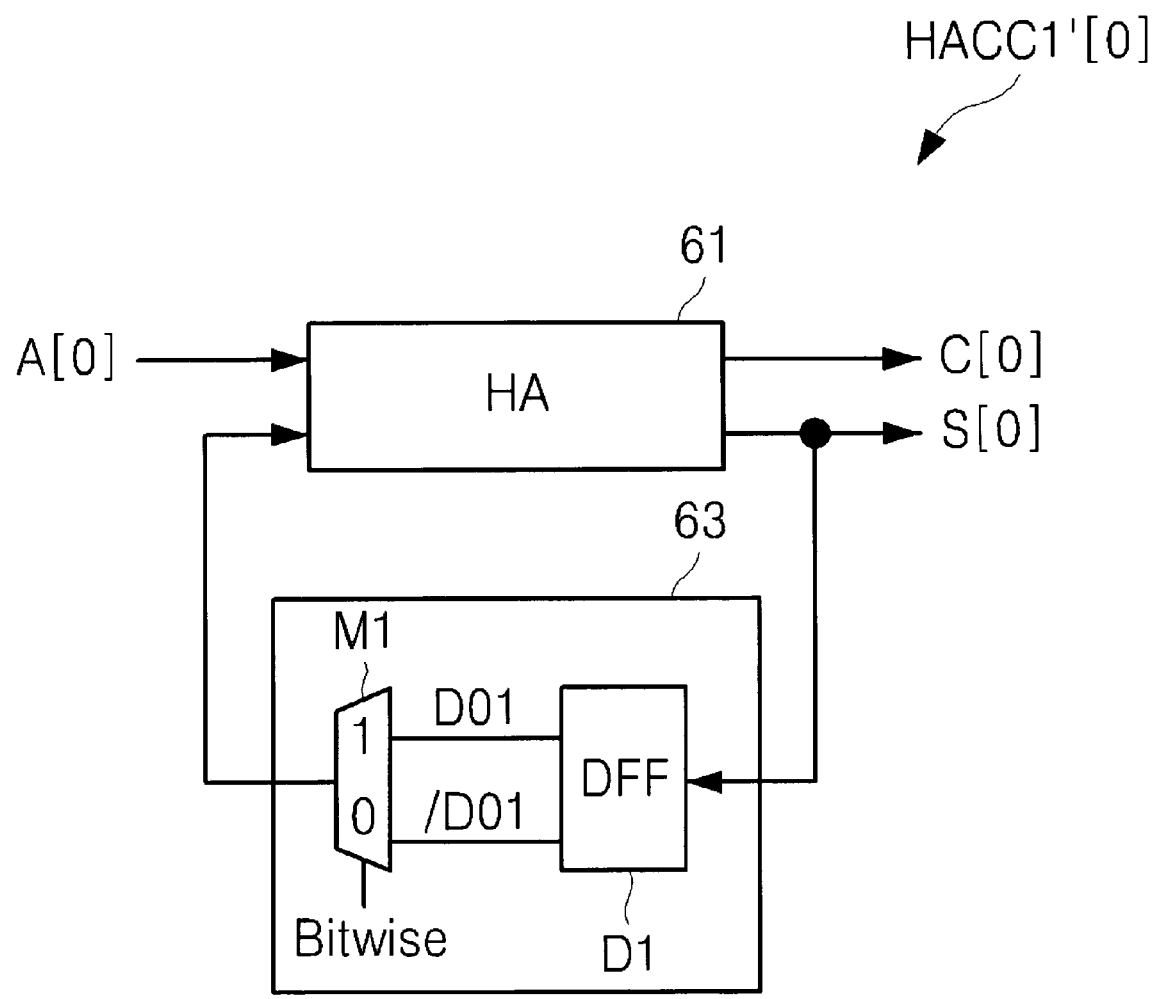
Figure 8C:
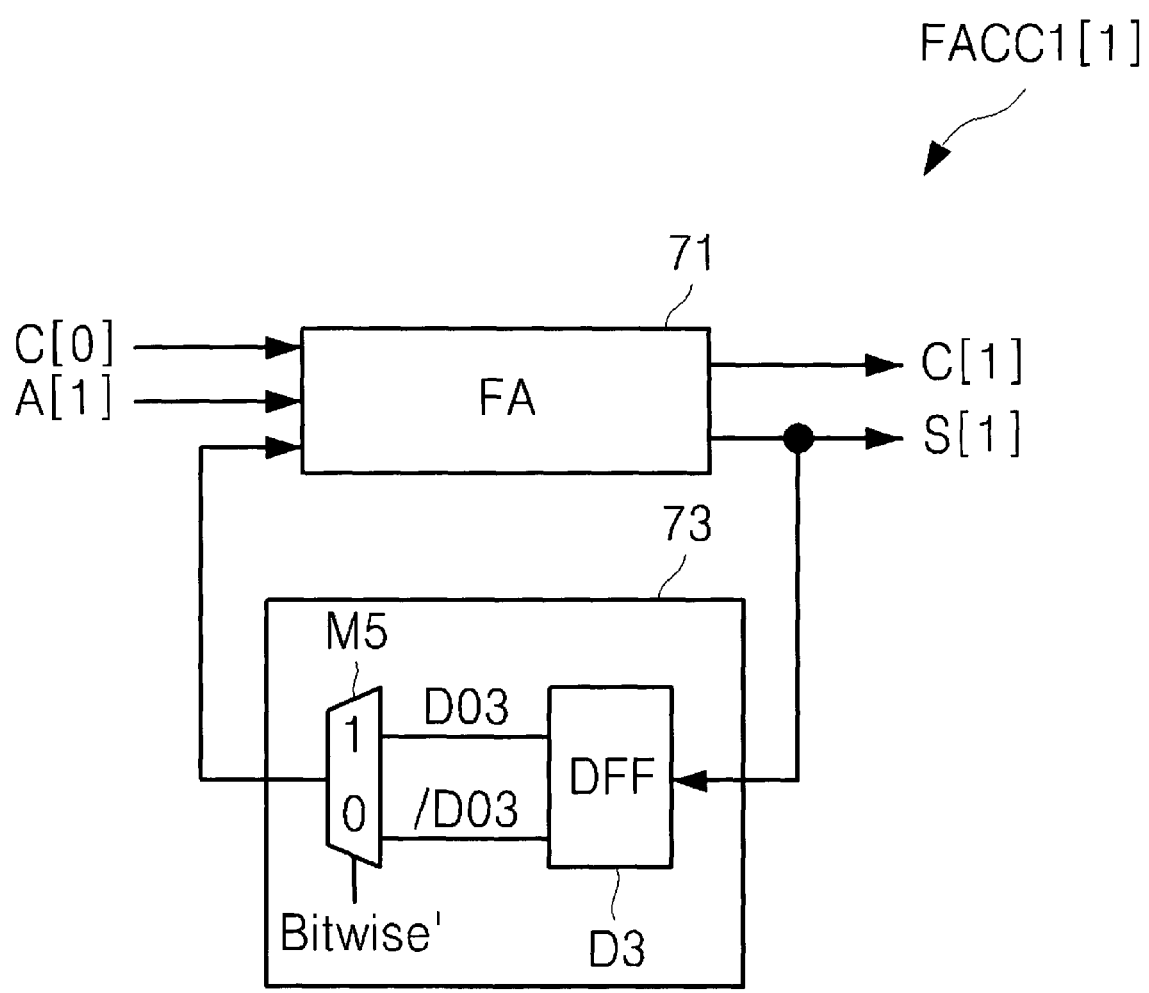

FIGS. 8A through 8C illustrate the adding units HACC1[8], HACC1'[0] and FACC1[1] which are manifested in the decimation filter 14" illustrated in FIG. 7A. It should understood that adding units HACC1[9] through HACC1[13] have the same configuration of the adding unit HACC1[8], therefore, a detailed description of the adding units HACC1[9] through HACC1[13] will be omitted. It should understood that adding units FACC1[2] through FACC1[7] have the same configuration of the adding unit FACC1[1], therefore, a detailed description of the adding units FACC1[2] through FACC1[7] will be omitted. FIG. 8 is a graph for explaining a process in which the decimation filter 14" performs digital CDS. The first digital data generator 16 counts M-bit reset data, which results from performing sigma-delta modulation of a reset signal output from a unit pixel, and outputs first N-bit reset data based on a count result. The first digital data generator 16 also counts M-bit image data, which results from performing sigma-delta modulation of an image signal output from the unit pixel, and outputs N-bit image data based on a count result.

The second digital data generator 18" generates P-bit reset data based on the first N-bit reset data and second N-bit reset data, i.e., previous N-bit reset data, which has been stored before the first N-bit reset data is input, performs bitwise inversion of the P-bit reset data, adds the N-bit image data to bitwise inverted data resulting from the bitwise inversion, and outputs an addition result as digital CDS multi-bit pixel data.

The second digital data generator 18" includes a lower bit generator 20" and an upper bit generator 22". The lower bit generator 20" may include adding units HACC1'[0] and FACC1[1] through FACC1[7]. The upper bit generator 22" may include the adding units HACC1[8] through HACC1[13].

To perform digital CDS, the adding units HACC1'[0], FACC1[1] through FACC1[7], and HACC1[8] through HACC1[13] are included in the second digital data generator 18". Each of the adding units HACC1'[0], FACC1[1] through FACC1[7], and HACC1[8] through HACC1[13] may perform bitwise inversion of P-bit reset data at a time point t at which reset data corresponding to a reset signal is finally integrated and output and add bitwise inverted data to N-bit image data, thereby outputting digital CDS multi-bit pixel data.

Each of the adding units HACC1'[0] and HACC1[8] through HACC1[13] may include an adder 61 and a delay/inversion unit 63, as illustrated in FIGS. 8A and 8B. As shown in FIG. 8B, the adder 61 of the adding unit HACC1'[0] may add the output signal A[0] of the first digital data generator 16 and a previous output signal and outputs an addition result. The delay/inversion unit 63 may latch an output signal of the adder 61 based on a clock signal (not shown). The delay/inversion unit 63 may also perform bitwise inversion of a latched signal at the time point T1, at which reset data is finally counted and output, and outputs a bitwise-inverted signal.

The delay/inversion unit 63 may include a latch D1 and a multiplexer M1. The latch D1 may latch an output signal of the adder 61 based on the clock signal. The multiplexer M1 may output a latched signal D01 or an inverted latched signal/D01 in response to a bitwise inversion selection signal "Bitwise". For example, the multiplexer M1 may output the latched signal D01 in response to the bitwise inversion selection signal "Bitwise" at a first logic level (e.g., a high level of "1") and output the inverted latched signal/D01 in response to the bitwise inversion selection signal "Bitwise" at a second logic level (e.g., a low level of "0").

Each of the adding units FACC1[1] through FACC1[7] may include an adder 71 and a delay/inversion unit 73, as illustrated in FIG. 8C. The adder 71 may add its previous output signal, the output signal A[1] of the first digital data generator 16', and the carry signal C[0] output from the preceding adding unit HACC'[0] and output an addition result. The delay/inversion unit 73 may latch an output signal of the adder 71 based on a clock signal (not shown). The delay/inversion unit 73 may also perform bitwise inversion of a latched signal at the time point T1, where reset data is finally counted and output, and output a bitwise-inverted signal.

The delay/inversion unit 73 may include a latch D3 and a multiplexer M5. The latch D3 may latch an output signal of the adder 71 based on the clock signal. The multiplexer M5 may output a latched signal D03 or an inverted latched signal/D03 in response to a bitwise inversion selection signal "Bitwise". For example, the multiplexer M5 may output the latched signal DO3 in response to the bitwise inversion selection signal "Bitwise" at a first logic level (e.g., a high level of "1") and output the inverted latched signal/DO3 in response to the bitwise inversion selection signal "Bitwise" at a second logic level (e.g., a low level of "0").

Figure 7B:
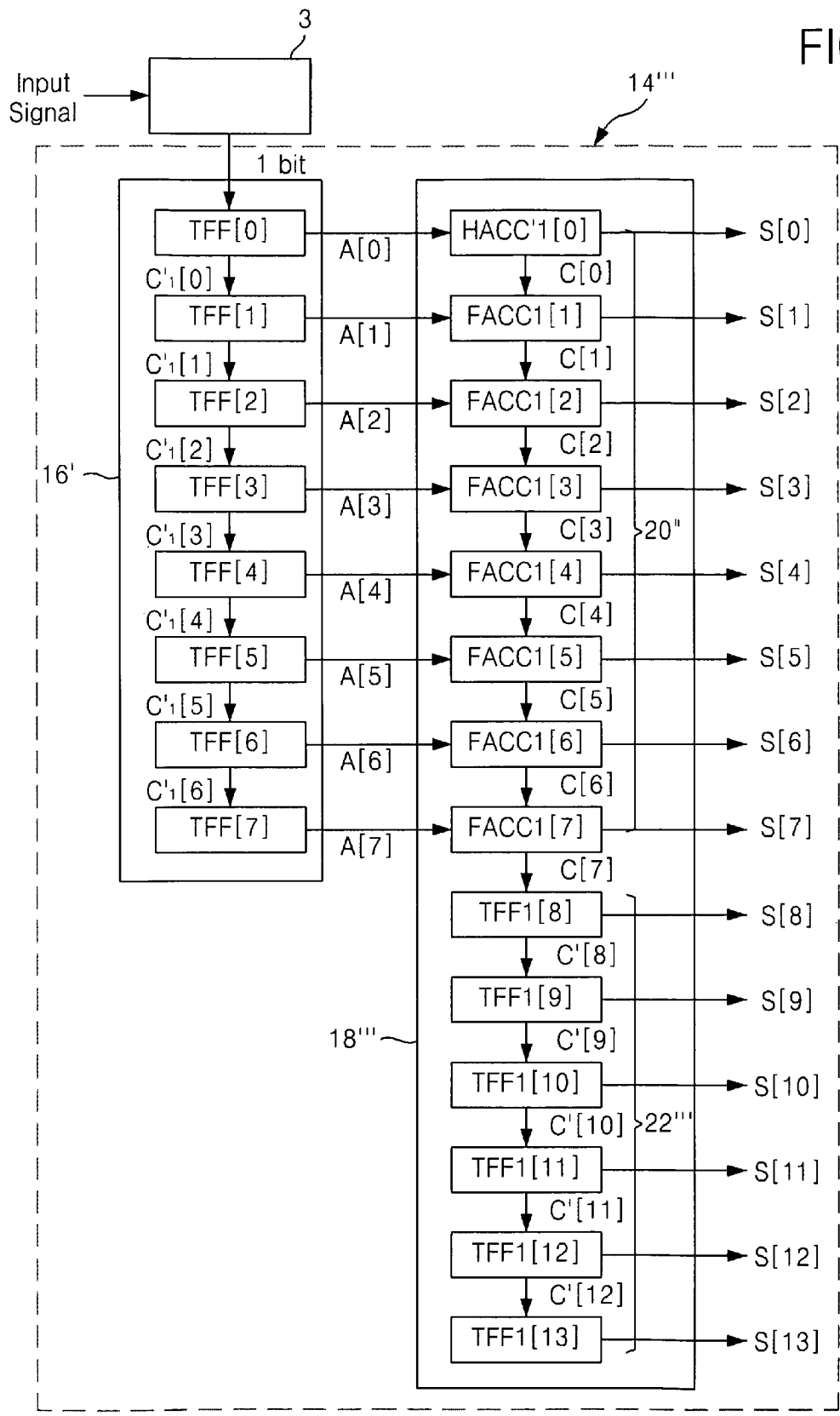

FIG. 7B illustrates another example embodiment of a decimation filter. As shown, a decimation filter 14'" includes the first digital data generator 16' (also illustrated in FIG. 5) and a second digital data generator 18'". The decimation filter 14'" is configured in the same manner as the decimation filter 14', e.g., the first digital data generator 16' outputs data to the second digital data generator 18'", except for the internal configuration of the adding units. Therefore, for the sake of clarity and brevity, the adding units of the decimation filter 14'" will be discussed.

The second digital data generator 18'" includes the lower bit generator 20" (also illustrated in FIG. 7A) and an upper bit generator 22'". The lower bit generator 20' may include the adding units HACC1'[0] and FACC1[1] through FACC1[7]. The upper bit generator 22'" may include adding units TFF1[8] through TFF1[13].

When the decimation filter 14'" performs digital CDS, each of the counter units TFF1[8] through TFF1[13] included in the second digital data generator 18'" illustrated in FIG. 7B performs bitwise inversion of a count result at the time point T1, where reset data corresponding to a reset signal is finally counted and output, and provide a bitwise-inverted count value to a succeeding counter unit. For instance, among the counter units TFF1[8] through TFF1[13], the first counter unit TFF1[8] may perform bitwise inversion of a count result at the time point T1, where reset data corresponding to a reset signal is finally counted and output, and provide a bitwise-inverted count value to the second counter unit TFF1[9] as a clock signal.

Figure 8D:
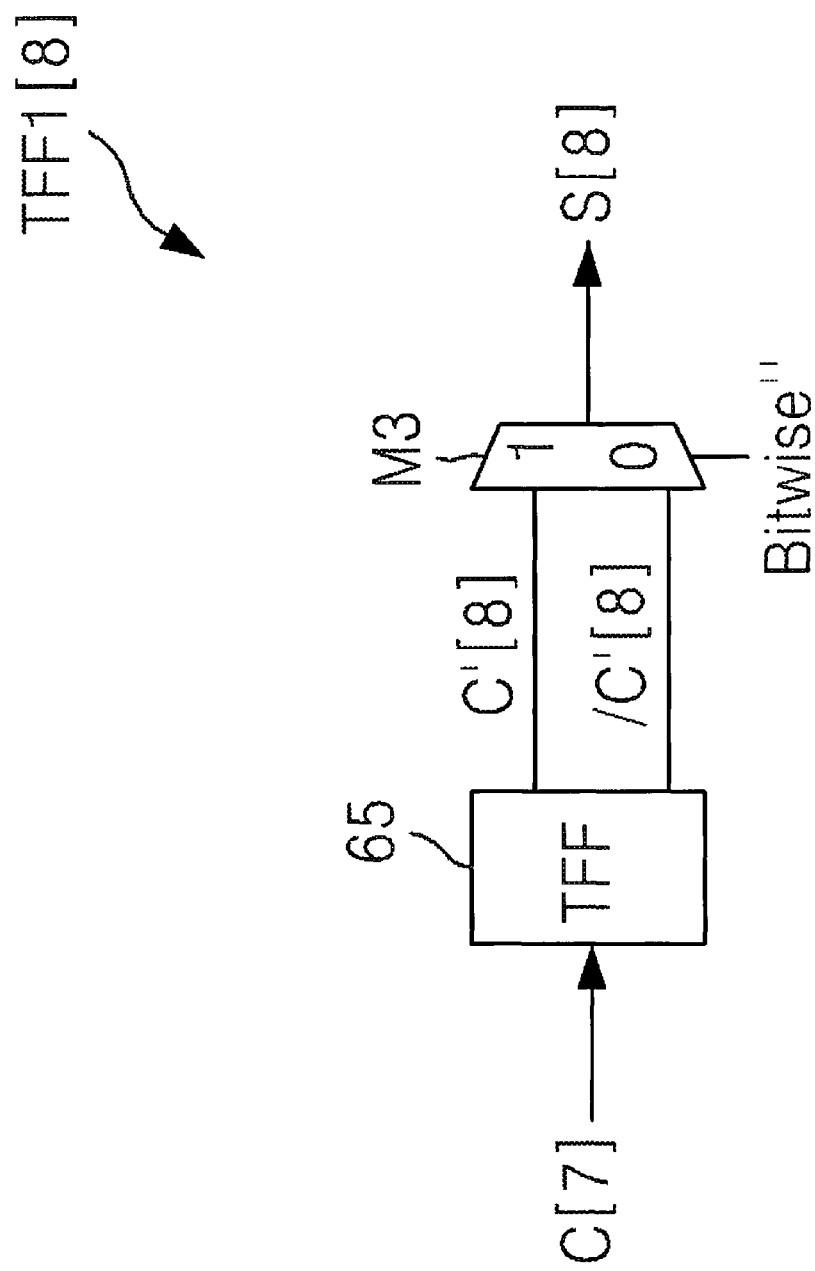

Each of the counter units TFF1[8] through TFF1[13] may be implemented as is illustrated in FIG. 8D. It should be understood that the counter units TFF1[9] through TFF1[13] have the same configuration of the counter unit TFF1[8], therefore, a detailed description of the adding units TFF1[9] through TFF1[13] will be omitted. The first counter unit TFF1[8] may include a T flip-flop 65 and a multiplexer M3. The T flip-flop 65 may count the input signal C[7] and output a count result C'[8]. The multiplexer M3 may output the count result C'[8] or an inverted count result/C'[8] in response to a bitwise inversion selection signal "Bitwise"". For example, the multiplexer M3 may output the count result C'[8] in response to the bitwise inversion selection signal "Bitwise"" at a first logic level (e.g., a high level of "1") and output the inverted count result/C'[8] in response to the bitwise inversion selection signal "Bitwise"" at a second logic level (e.g., a low level of "0").

Each of the adding units HACC1[0], FACC1[1] through FACC1[7], and HACC1[8] through HACC1[13] and the counter units TFF1[8] through TFF1[13] may output a reset bit forming reset data, performs bitwise inversion of a latched reset bit at the time point T1, at which the reset data is finally counted and output, and adds a bitwise inverted bit to an image bit forming image data, thereby outputting a bit forming digital data corresponding to a difference between an image signal and a reset signal which are output from a unit pixel.

Figure 9:
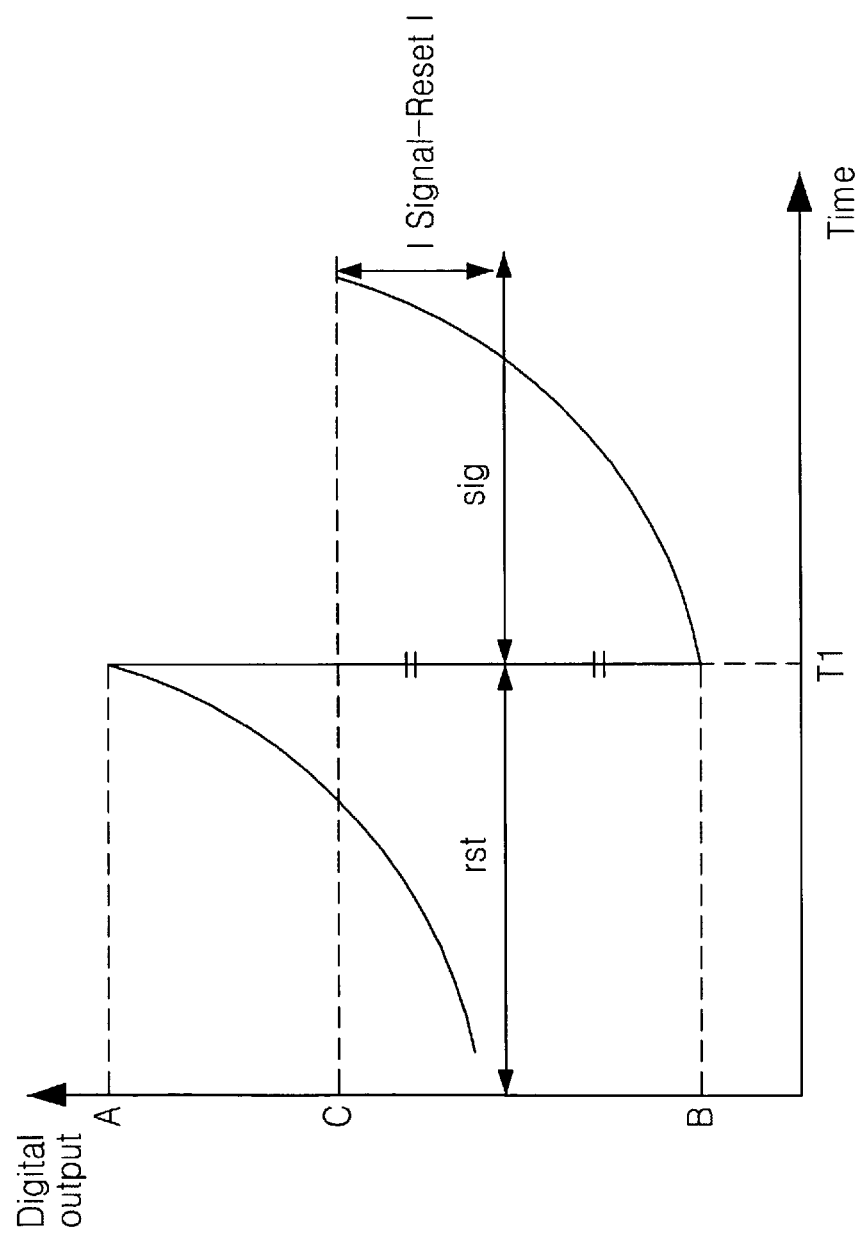
FIG. 9 illustrates a graph of digital correlated double sampling (CDS) according to an example embodiment.

In FIG. 9, reference character "A" denotes reset data (or digital code, i.e., P-bit reset data) corresponding to an analog reset signal generated from a unit pixel. The second digital data generator 18" or 18'" performs bitwise inversion of the P-bit reset data A, adds N-bit image data to bitwise-inverted data B, and outputs an addition result as digital CDS multi-bit pixel data C. In other words, the digital CDS multi-bit pixel data C is digital data corresponding to a difference between an image signal and a reset signal, which are output from a unit pixel. According to example embodiments, the decimation filter may perform digital CDS.

Figure 10:
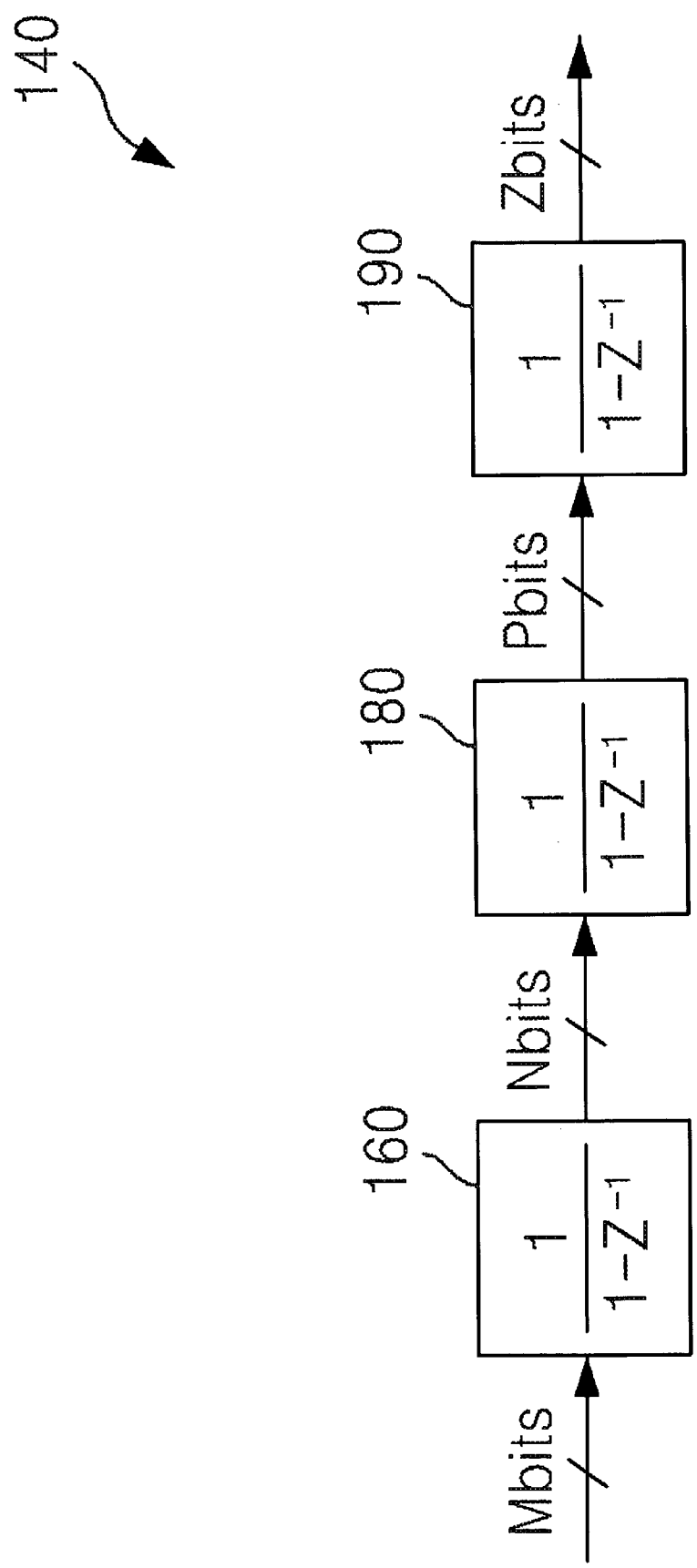
FIG. 10 is a block diagram of a decimation filter according to another example embodiment.

FIG. 10 is a block diagram of a decimation filter according to other example embodiments. A decimation filter 140 may include a first digital data generator 160, a second digital data generator 180, and a third digital data generator 190. The first digital data generator 160 and the second digital data generator 180 may function in the same manner as the first digital data generator 16 and the second digital data generator 18, respectively.

The third digital data generator 190 may integrate P-bit pixel data output from the second digital data generator 180, generate Z-bit pixel data (where Z is a real number which is the same as or greater than P) based on an integration result, and output the Z-bit pixel data as decimated data. The third digital data generator 190 may include a lower bit generator and an upper bit generator which perform functions which are the same as the lower bit generator 20 and the upper bit generator 22 included in the second digital data generator 18.

When decimated data, i.e., multi-bit pixel data of Z bits is composed of A-bit pixel data and B-bit pixel data, that is, when Z=A+B, the lower bit generator may add each of bits forming pixel data of P (e.g., 14) bits S[0] through S[13] and a corresponding bit among bits forming pixel data that has been stored before the P-bit pixel data S[0] through S[13] is input and output A-bit pixel data (where A is a real number) based on an addition result. The upper bit generator may output B-bit pixel data (where B is a real number) in response to a carry signal (not shown) output from the lower bit generator. The number of digital data generators included in the decimation filter 140 may be the same as or greater than the number of integration units 7 included in the sigma-delta modulator 3.

Figure 11:
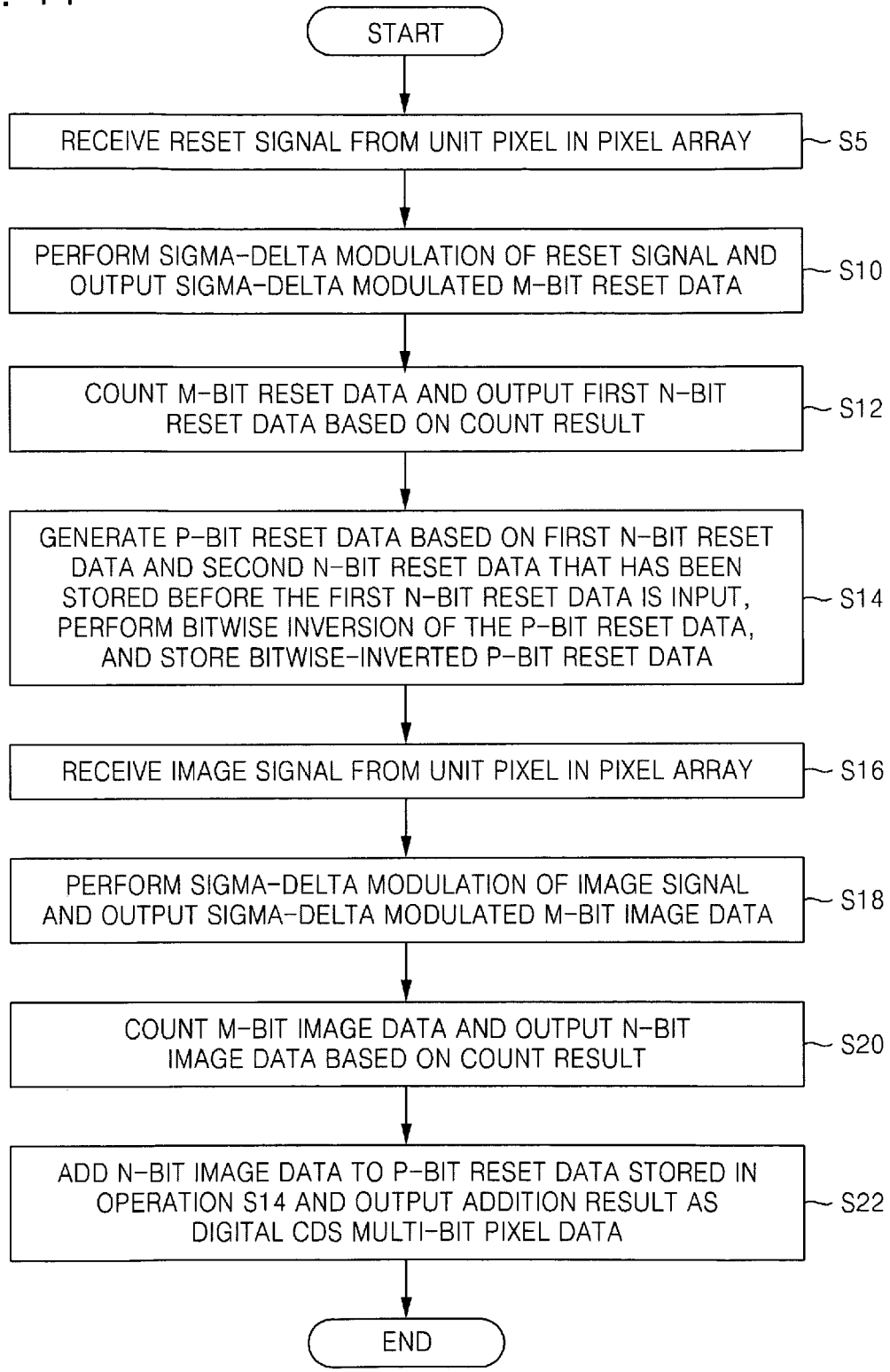
FIG. 11 is a flowchart of a CDS method according to an example embodiment.

FIG. 11 is a flowchart of a CDS method performed by the decimation filter 14 illustrated in FIG. 1. When a reset signal is output from a unit pixel in a pixel array at S5, the sigma-delta modulator 3 may perform sigma-delta modulation of the reset signal and outputs sigma-delta modulated M-bit reset data at S10. The first digital data generator 16 may count M-bit reset data and output first N-bit reset data based on a count result at S12. The second digital data generator 18 may generate P-bit reset data based on the first N-bit reset data and second N-bit reset data that has been stored before the first N-bit reset data is input, perform bitwise inversion of the P-bit reset data, and stores bitwise-inverted P-bit reset data at S14.

When an image signal is output from the unit pixel in the pixel array in operation S16, the sigma-delta modulator 3 may perform sigma-delta modulation of the image signal and output sigma-delta modulated M-bit image data at S18. At this time, operations at S14 and S18 may be performed simultaneously. The first digital data generator 16 may count M-bit image data and output N-bit image data based on a count result at S20. The second digital data generator 18 may add the N-bit image data to the P-bit reset data stored at S14 and output an addition result as digital CDS multi-bit pixel data at S22.

Figure 12:
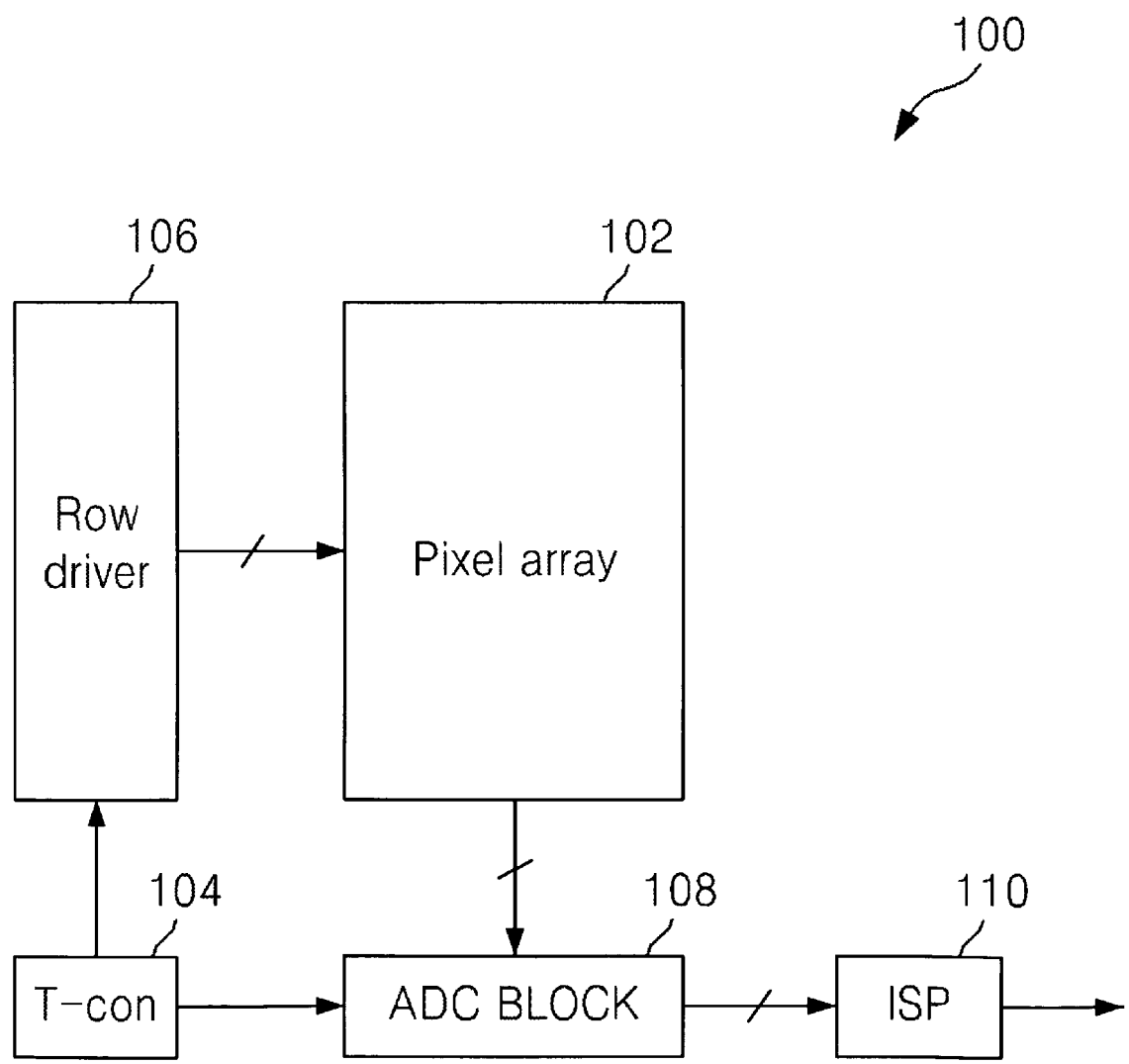
FIG. 12 is a block diagram of an image sensor according an example embodiment.

FIG. 12 is a block diagram of an image sensor according to some embodiments of the present invention. An image sensor 100 may include a pixel array 102, a timing control 104, a row driver 106, an ADC block 108, and an image signal processor (ISP) 110.

The pixel array 102 may include a plurality of pixels (not shown) connected with a plurality of row lines (not shown)

and a plurality of columns (not shown) in a two-dimensional matrix form. The timing controller 104 may output a plurality of control signals for controlling the operations of the row driver 106 and the ADC block 108 and may generate addressing signals for outputting an image signal sensed in the pixel array 102.

The ADC block 108 may include a plurality of ADCs (1 in FIG. 1). Each ADC 1 may perform analog-to-digital conversion and digital CDS with respect to pixel signals (e.g., a reset signal and an image signal) output from pixels connected to a corresponding one of the columns in the pixel array 102. The ISP 110 may perform digital image processing based on digital data output from the ADC block 108.

According to embodiments of the present invention, a decimation filter can have a simple structure and decimate a sigma-delta modulated pixel signal quickly and precisely. In addition, since the decimation filter performs digital CDS, a separate circuit for CDS is not necessary, and therefore, an area of an image sensor can be reduced. In addition; since the decimation filter uses a counter, complexity is not increased.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A decimation filter comprising:
a first digital data generator configured to integrate sigma-delta modulated M-bit pixel data and output N-bit pixel data based on an integration result, where M is a real number and N is a natural number greater than M; and
a second digital data generator configured to integrate the N-bit pixel data, generate P-bit pixel data based on an integration result, and output the P-bit pixel data as decimated data, where P is a natural number greater than N.

2. The decimation filter of claim 1, wherein
the first digital data generator integrates M-bit reset data and outputs N-bit reset data as an integration result, and
the second digital data generator integrates the N-bit reset data, generates P-bit reset data based on an integration result, performs bitwise inversion of the P-bit reset data, adds the N-bit image data to bitwise-inverted data, and outputs an addition result as digital correlated double sampling (CDS) multi-bit pixel data.

3. The decimation filter of claim 1, wherein the first digital data generator comprises a plurality of adding units connected in series, each of the plurality of adding units adds an input signal and a previous output signal and outputs a carry signal and an output signal which correspond to an addition result, the output signals of the plurality of adding units being the N-bit pixel data.

4. The decimation filter of claim 3, wherein
the M-bit pixel data is input to a first of the plurality of adding units as an input signal, and
the carry signal of each of the plurality of adding units is an input signal for a succeeding adding unit of the plurality of adding units.

5. The decimation filter of claim 3, wherein each of the plurality of adding units comprises:
a latch circuit configured to latch the previous output signal; and
an adder configured to add the input signal and the previous output signal and output the carry signal and the output signal.

6. The decimation filter of claim 5, wherein the latch circuit is implemented by a D flip-flop and the adder is implemented by a half adder.

7. The decimation filter of claim 1, wherein the first digital data generator comprises a plurality of counter units connected in series, the M-bit pixel data is provided to a first of the plurality counter units as a clock signal, and a carry signal of each of the plurality of counter units is provided as a clock signal to a succeeding counter unit of the plurality of counter units.

8. The decimation filter of claim 1, wherein the second digital data generator comprises:
a lower bit generator configured to integrate the N-bit pixel data and output R-bit pixel data based on an integration result, where R is a natural number; and
an upper bit generator configured to output Q-bit pixel data in response to a carry signal output from the lower bit generator, where Q is a natural number, and
wherein the P-bit pixel data comprises the R-bit pixel data and the Q-bit pixel data.

9. The decimation filter of claim 8, wherein the lower bit generator comprises a plurality of adding units connected in series, each of the plurality of adding units adds a input signal and a previous output signal and outputs a carry signal and an output signal which correspond to an addition result, the output signals of the plurality of adding units being the R-bit pixel data.

10. The decimation filter of claim 9, wherein each of the plurality of adding units comprises:
a latch circuit configured to latch the previous output signal; and
an adder configured to add the input signal and the previous output signal and output the carry signal and the output signal which correspond to an addition result.

11. The decimation filter of claim 10, wherein the latch circuit is implemented by a D flip-flop and the adder is implemented by a full adder.

12. The decimation filter of claim 9, wherein
each of the plurality of adding units receives a corresponding bit among bits in the N-bit pixel data, and
the carry signal of each of the plurality of adding units is input to a succeeding adding unit of the plurality of adding units.

13. The decimation filter of claim 12, wherein
a first adding unit of the plurality of adding units receives a carry signal from an adding unit in the lower bit generator, and
a carry signal of each of the first through Q-th adding units is input to a succeeding adding unit in the plurality of adding units.

14. The decimation filter of claim 8, wherein the upper bit generator comprises a plurality of adding units connected in series, each of the plurality of adding units adds a input signal and a previous output signal and outputs a carry signal and an output signal which correspond to an addition result, the output signals of the plurality of adding units being the Q-bit pixel data.

15. The decimation filter of claim 14, wherein each of the plurality of adding units comprises:
a latch circuit configured to latch the previous output signal; and
an adder configured to add the input signal and the previous output signal and output the carry signal and the output signal which correspond to an addition result.

16. The decimation filter of claim 8, wherein the upper bit generator comprises:

a plurality of counter units connected in series, a carry signal of one of the plurality of adding units is input to a first counter unit of the plurality of counter units as a clock signal, and a carry signal of each of the plurality of counter units is provided as a clock signal to a succeeding counter unit of the plurality of counter units.

17. The decimation filter of claim 1, further comprising a third digital data generator configured to integrate the P-bit pixel data, generate Z-bit pixel data based on an integration result, and output the Z-bit pixel data as the decimated data, where Z is a natural number greater than P.

18. An analog-to-digital converter comprising:
a sigma-delta modulator configured to perform sigma-delta modulation of an analog pixel signal and output sigma-delta modulated M-bit pixel data, where M is a real number; and
a decimation filter configured to decimate the M-bit pixel data and output decimated multi-bit data, the decimation filter comprising a plurality of digital data generators, which are connected in cascade and sequentially decimate the M-bit pixel data.

19. The analog-to-digital converter of claim 18, wherein the number of digital data generators is the same as or greater than the number of integrators included in the sigma-delta modulator.

20. An image sensor comprising:
an analog-to-digital converter, the analog-to-digital converter including,
a sigma-delta modulator configured to perform sigma-delta modulation of an analog pixel signal and output sigma-delta modulated M-bit pixel data, where M is a real number; and
a decimation filter configured to decimate the M-bit pixel data and output decimated multi-bit data, the decimation filter comprising a plurality of digital data generators, which are connected in cascade and sequentially decimate the M-bit pixel data, the decimation filter including,
a first digital data generator configured to integrate sigma-delta modulated M-bit pixel data and output N-bit pixel data based on an integration result, where N is a natural number greater than M, and
a second digital data generator configured to integrate the N-bit pixel data, generate P-bit pixel data based on an integration result, and output the P-bit pixel data as decimated data, where P is a natural number greater than N.

* * * * *